United States Patent
Sakuma

(10) Patent No.: US 11,791,610 B2
(45) Date of Patent: Oct. 17, 2023

(54) SEMICONDUCTOR LASER DEVICE MANUFACTURING METHOD AND SEMICONDUCTOR LASER DEVICE

(71) Applicant: Mitsubishi Electric Corporation, Tokyo (JP)

(72) Inventor: Hitoshi Sakuma, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 491 days.

(21) Appl. No.: 17/252,840

(22) PCT Filed: Aug. 20, 2018

(86) PCT No.: PCT/JP2018/030657
§ 371 (c)(1),
(2) Date: Dec. 16, 2020

(87) PCT Pub. No.: WO2020/039475
PCT Pub. Date: Feb. 27, 2020

(65) Prior Publication Data
US 2021/0126433 A1    Apr. 29, 2021

(51) Int. Cl.
*H01S 5/227* (2006.01)
*H01S 5/042* (2006.01)
*H01S 5/02* (2006.01)

(52) U.S. Cl.
CPC .......... *H01S 5/2275* (2013.01); *H01S 5/0208* (2013.01); *H01S 5/04256* (2019.08)

(58) Field of Classification Search
None
See application file for complete search history.

(56) References Cited

U.S. PATENT DOCUMENTS

| 2008/0157106 A1 | 7/2008 | Masui et al. |
| 2010/0003778 A1* | 1/2010 | Tada .................... H01S 5/22 |
| | | 257/E33.006 |
| 2019/0296523 A1 | 9/2019 | Yamaguchi |

FOREIGN PATENT DOCUMENTS

| JP | H10-303179 A | 11/1998 |
| JP | H11-186219 A | 7/1999 |
| JP | 2005-116659 A | 4/2005 |

(Continued)

OTHER PUBLICATIONS

An Office Action mailed by China National Intellectual Property Administration dated Nov. 26, 2021, which corresponds to Chinese Patent Application No. 201880096225.8 and is related to U.S. Appl. No. 17/252,840; with English language translation.

(Continued)

*Primary Examiner* — Tuan N Nguyen
(74) *Attorney, Agent, or Firm* — Studebaker & Brackett PC

(57) ABSTRACT

The present invention is characterized by comprising: forming a stacked structure in which a lower cladding layer, an active layer and an upper cladding layer are stacked on an InP substrate in a shape having a mesa stripe structure; forming a first insulation film on the stacked structure by a sputtering method; forming a second insulation film thinner than the first insulation film, on the first insulation film by a plasma CVD method at a film forming temperature higher than that when the first insulation film has been formed; and forming a first electrode on the upper cladding layer, and forming a second electrode on a back surface of the InP substrate.

11 Claims, 3 Drawing Sheets

(56) References Cited

FOREIGN PATENT DOCUMENTS

| | | |
|---|---|---|
| JP | 2005-167118 A | 6/2005 |
| JP | 2008-182202 A | 8/2008 |
| JP | 2010-016281 A | 1/2010 |
| JP | 2012-234862 A | 11/2012 |
| JP | 2016-167486 A | 9/2016 |
| WO | 2018-109982 A1 | 6/2018 |

OTHER PUBLICATIONS

International Search Report; Written Opinion; and Notification of Transmittal of the International Search Report and the Written Opinion of the International Searching Authority, or the Declaration issued in PCT/JP2018/030657; dated Nov. 6, 2018.

An Office Action; "Notice of Reasons for Refusal", mailed by the Japanese Patent Office dated Mar. 30, 2021, which corresponds to Japanese Patent Application No. 2020-036620 and is related to U.S. Appl. No. 17/252,840; with English language translation.

* cited by examiner

SEMICONDUCTOR LASER DEVICE MANUFACTURING METHOD AND SEMICONDUCTOR LASER DEVICE

FIELD

The present invention relates to a semiconductor laser device manufacturing method and a semiconductor laser device.

BACKGROUND

A semiconductor laser device is a key device of an ultra-high-speed and high-efficiency optical network for communicating a large amount of data, and its reliability has become increasingly important. For example, in a ridge type semiconductor laser device for telecommunication, an insulation film is arranged in the vicinity of an active layer. This is because light is thereby confined in a waveguide with the use of a difference in refractive index between a ridge and both sides thereof. Light generated in the active layer exudes to the insulation film, and a part of the light leaks to an electrode on the insulation film and is absorbed there, which decreases the efficiency. In order to prevent this, it may be conceivable to increase a thickness of the insulation film, but this leads to an increase in a stress applied to the active layer, and then characteristics change or a crystal defect. In addition, when the insulation film is formed by plasma, there has been a problem that the active layer is damaged and accordingly reliability cannot be secured.

In Patent Literature 1, in order to solve the above problems, the insulation film has a two-layer structure; and as a first layer, an SiN film is formed so as to have a thickness of 50 nm by a thermal CVD method at a film forming temperature of about 600° C., and as a second layer, an SiN film is formed so as to have a thickness of 100 nm by a plasma CVD method at a film forming temperature of about 300° C. It is described in Patent Literature 1 that by setting the film forming temperature of the SiN film of the second layer to a temperature lower than the film forming temperature of the SiN film of the first layer, the stress which is applied to the semiconductor layer becomes low, even if the SiN film of the second layer is thickened, and accordingly the reliability can be secured. Furthermore, it is also described in Patent Literature 1 that when the SiN film of the second layer is formed by the plasma CVD method, the plasma does not directly hit the semiconductor layer, because the SiN film of the first layer exists, and a decrease in reliability due to plasma damage can be prevented.

PRIOR ART

Patent Literature

[PTL 1] JP 2010-16281 A

SUMMARY

Technical Problem

For example, in an InP-based semiconductor laser for telecommunication, there has been a problem that when an insulation film is formed by high-temperature film formation at about 600° C. as in the case of thermal CVD, a semiconductor material is thermally decomposed.

An object of the present invention, which has been made so as to solve the above problems, is to provide a semiconductor laser device manufacturing method that can improve reliability by reducing stress on and damage to an active layer, and providing a semiconductor laser device.

Means for Solving the Problems

According to this invention, a semiconductor laser device manufacturing method includes forming a stacked structure in which a lower cladding layer, an active layer and an upper cladding layer are stacked on an InP substrate in a shape having a mesa stripe structure, forming a first insulation film on the stacked structure by a sputtering method, forming a second insulation film thinner than the first insulation film, on the first insulation film by a plasma CVD method at a film forming temperature higher than that when the first insulation film has been formed, and forming a first electrode on the upper cladding layer, and forming a second electrode on a back surface of the InP substrate.

According to another aspect of this invention, a semiconductor laser device manufacturing method includes forming a stacked structure in which a lower cladding layer, an active layer and an upper cladding layer are stacked on an InP substrate in a shape having a mesa stripe structure, forming a first insulation film on the stacked structure by an ALD method, forming a second insulation film thicker than the first insulation film on the first insulation film by a sputtering method, and forming a first electrode on the upper cladding layer, and forming a second electrode on a back surface of the InP substrate.

According to this invention, a semiconductor laser device includes an InP substrate, a stacked structure in which a lower cladding layer, an active layer and an upper cladding layer are stacked on the InP substrate in a shape having a mesa stripe structure, a first insulation film that is formed in a root portion of the mesa stripe structure, while avoiding an upper portion of a side face of the mesa stripe structure, a second insulation film that covers the first insulation film and the stacked structure, while exposing an upper portion of the upper cladding layer, a first electrode that is electrically connected to the upper cladding layer, and a second electrode that is formed on a back surface of the InP substrate.

Other features of the present invention will be disclosed below.

Advantageous Effects of Invention

According to the present invention, for example, firstly the first insulation film is formed by the sputtering method, and then the second insulation film is formed which is thinner than the first insulation film on the first insulation film by the plasma CVD method having a film forming temperature higher than that when the first insulation film has been formed, thereby the stress and damage to the active layer are reduced, and the reliability of the semiconductor laser device can be improved.

DESCRIPTION OF EMBODIMENTS

A semiconductor laser device manufacturing method and a semiconductor laser device according to an embodiment will be described below with reference to the drawings. In some cases, the same symbol is attached to the same or corresponding constituent elements, and the repetitive description is omitted.

Embodiment 1

Figure 1:
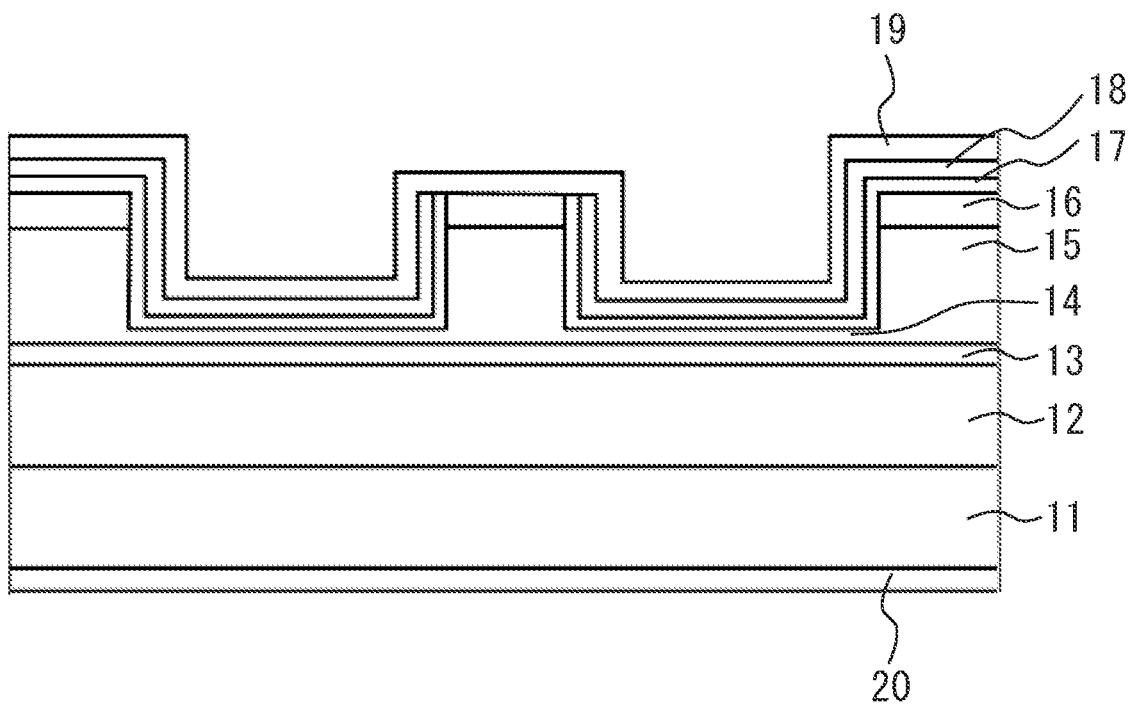
FIG. 1 is a cross-sectional view of a semiconductor laser device according to Embodiments 1 and 2.

FIG. 1 shows a cross-sectional view of a semiconductor laser device according to Embodiment 1. The semiconductor laser device includes an InP substrate 11 formed from n-type InP. An n-type lower cladding layer 12 is formed on the InP substrate 11. An active layer 13 is formed on the lower cladding layer 12. On the active layer 13, a p-type first upper cladding layer 14 and a p-type second upper cladding layer 15 are formed in this order. The first upper cladding layer 14 and the second upper cladding layer 15 are two layers formed separately. However, these layers may be combined into one layer while maintaining the shape. A p-type contact layer 16 is formed on the second upper cladding layer 15.

Thus, the stacked structure is formed in which the lower cladding layer 12, the active layer 13, the first and second upper cladding layers 14 and 15, and the contact layer 16 are stacked on the InP substrate 11. This stacked structure is formed into a shape having a mesa stripe structure. In the example of FIG. 1, the mesa stripe structure is formed which has the second upper cladding layer 15 and the contact layer 16 on the first upper cladding layer 14. It is arbitrary which layer in the stacked structure is formed into the mesa stripe structure. For example, the mesa stripe structure may be formed by all the layers constituting the stacked structure. The stacked structure can be formed from, for example, a GaInAsP-based semiconductor material.

Two insulation films are formed on the stacked structure, which are a first insulation film 17 and a second insulation film 18. The first insulation film 17 and the second insulation film 18 cover the mesa stripe structure while exposing the upper surface of the contact layer 16. A first electrode 19 is formed on the contact layer 16 which is exposed from the first insulation film 17 and the second insulation film 18. The first electrode 19 functions as a p-side electrode. A second electrode 20 is formed on the back surface of the InP substrate 11. The second electrode 20 functions as an n-side electrode. The semiconductor laser device applies a voltage between the first electrode 19 and the second electrode 20, when being operated, and emits laser light in the front direction of the sheet or in the depth direction of the sheet of FIG. 1.

Figure 2:
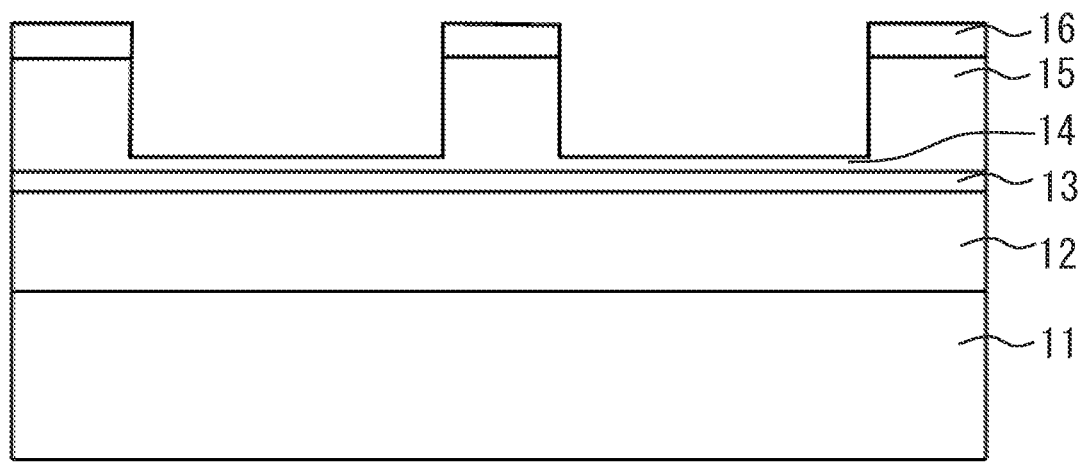
FIG. 2 shows a cross-sectional view of the semiconductor laser device during manufacturing.

Next, a semiconductor laser device manufacturing method according to Embodiment 1 will be described. Firstly, on the InP substrate 11, a stacked structure is formed in which the lower cladding layer 12, the active layer 13, the first and second upper cladding layers 14 and 15, and the contact layer 16 are stacked. This stacked structure is subjected to photolithography and dry etching, and the stacked structure is thereby formed into a shape having the mesa stripe structure. FIG. 2 shows a cross-sectional view of the semiconductor laser device, which shows that the stacked structure having the mesa stripe structure is formed on the InP substrate 11.

Figure 3:
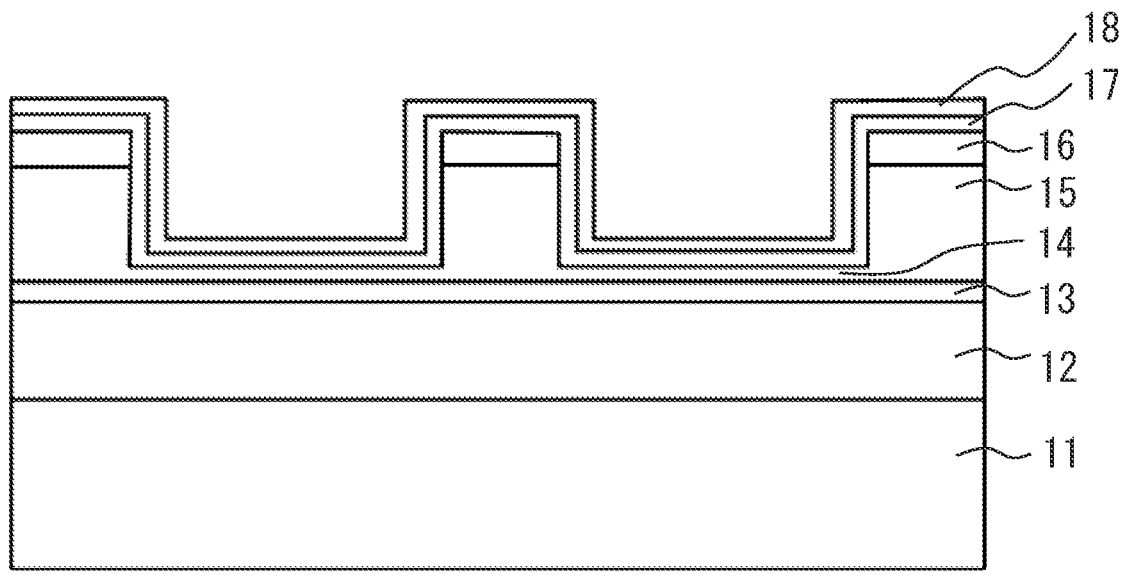
FIG. 3 shows a cross-sectional view of the semiconductor laser device during manufacturing.

Next, the first insulation film 17 and the second insulation film 18 are formed. FIG. 3 shows a cross-sectional view of the semiconductor laser device in which the first insulation film 17 and the second insulation film 18 have been formed. The first insulation film 17 is formed on the stacked structure by a sputtering method. The film forming temperature of the first insulation film 17 can be set at about 150° C. The film forming temperature of the first insulation film 17 is in a range of 140 to 160° C., for example. The film thickness of the first insulation film 17 is 300 to 700 nm, for example. A material of the first insulation film 17 is not particularly limited as long as the material is an insulation film, and is, for example, an oxide film such as an SiO film.

The second insulation film 18 is formed on the first insulation film 17 by a plasma CVD method at a film forming temperature higher than that when the first insulation film 17 has been formed. The film forming temperature of the second insulation film 18 can be set at about 300° C. The film forming temperature of the second insulation film 18 is in a range of 290 to 310° C., for example. The second insulation film 18 is thinner than the first insulation film 17. The film thickness of the second insulation film 18 is, for example, 100 nm or smaller. A material of the second insulation film 18 is not particularly limited as long as the material is an insulation film, and is, for example, an oxide film such as an SiO film.

Figure 4:
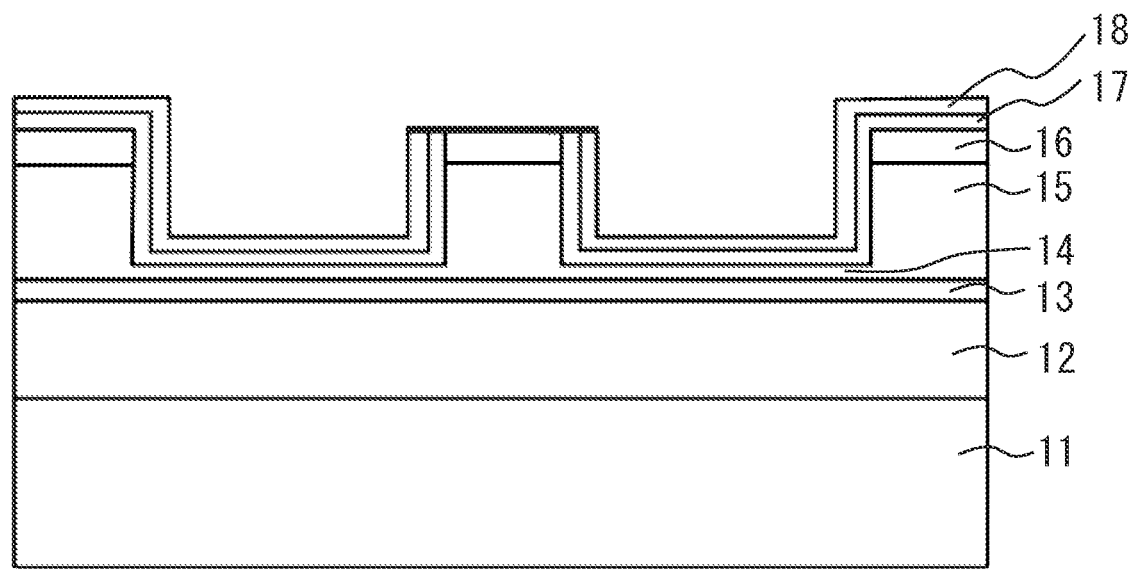
FIG. 4 shows a cross-sectional view of the semiconductor laser device during manufacturing.

Next, the contact layer 16 is exposed. FIG. 4 shows a cross-sectional view of the semiconductor laser device in which the upper surface of the contact layer 16 is exposed. In this step, portions of the first insulation film 17 and the second insulation film 18, which have been formed on the mesa stripe structure, are removed, and the upper surface of the contact layer 16 is exposed.

Next, the first electrode 19 and the second electrode 20 are formed. FIG. 1 shows the cross-sectional view of the semiconductor laser device in which the first electrode 19 and the second electrode 20 are formed. The first electrode 19 which functions as a p-side electrode is formed above the second upper cladding layer 15 so as to come in contact with the contact layer 16, and also covers the entire second insulation film 18. The film thickness of the first electrode 19 can be set in a range of 400 nm to 500 nm, for example. The surface of the first electrode 19 may be plated with Au. After that, the InP substrate 11 is thinned, and the second electrode 20 is formed on the back surface of the InP substrate 11 directly or via an electro-conductive layer. Thus, the InP-based semiconductor laser device is manufactured in which the semiconductor layer on which the ridge is formed is covered with the insulation film. This semiconductor laser device can be used, for example, for telecommunication applications.

In the semiconductor laser device manufacturing method according to Embodiment 1, the first insulation film 17 was formed by the sputtering method, and the second insulation film 18 thinner than the first insulation film 17 was formed by the plasma CVD method. By adopting the sputtering method, it becomes possible to form the first insulation film 17 which has a small stress at a low film forming temperature. On the other hand, the second insulation film 18 is formed by the plasma CVD method which has a large stress and has a high film forming temperature, and is made thinner than the first insulation film 17. In the above example, the film thickness of the first insulation film 17 was set at 300 to 700 nm, and the film thickness of the second insulation film 18 was set at 100 nm or less. Thereby, the stress to the active layer 13 can be reduced, which is caused by the formation of the first insulation film 17 and the second insulation film 18.

In addition, the first insulation film 17 is formed by the sputtering method, as an insulation film that comes in contact with the stacked structure which is the semiconductor layer, and thereby damage to the semiconductor layer can be reduced, as compared with the case where the first insulation film is formed by the plasma CVD method. On the other hand, the sputtering method has a poor coverage, and accordingly, if only the first insulation film is used as the insulation layer, the degradation of characteristics can occur, which is caused by contact between the electrode and the semiconductor layer. Then, the contact between the electrode and the semiconductor layer is suppressed by the second insulation film 18 that is formed by the plasma CVD method which is a film forming method having a satisfactory coverage. As a result, the reliability of the semiconductor laser device can be enhanced.

The semiconductor laser device manufacturing method and the semiconductor laser device according to Embodiment 1 can be modified in various ways. For example, the electro-conductivity type of each layer in the semiconductor laser device can be reversed. A stacked structure in which the contact layer 16 is omitted may be adopted. The modifications mentioned in Embodiment 1 can also be applied to a semiconductor laser device manufacturing method and a semiconductor laser device according to the following embodiments. The semiconductor laser device manufacturing method and the semiconductor laser device according to the following embodiments have many common points to those in Embodiment 1, and accordingly, differences from Embodiment 1 will be mainly described.

Embodiment 2

The semiconductor laser device manufacturing method according to Embodiment 2 is the same as that in Embodiment 1, in a point that the stacked structure having the mesa stripe structure is formed and the configuration of FIG. 2 is obtained. However, the first insulation film 17 in Embodiment 2 is formed on the stacked structure by an ALD (Atomic Layer Deposition) method. The film forming temperature of the first insulation film 17 can be set at about 150° C. The film forming temperature of the first insulation film 17 is in a range of 140 to 160° C. for example. The film thickness of the first insulation film 17 is, for example, 100 nm or smaller. A material of the first insulation film 17 is not particularly limited as long as the material is an insulation film, and is, for example, an oxide film such as an SiO film.

In Embodiment 2, the second insulation film 18 thicker than the first insulation film 17 is formed on the first insulation film 17 by the sputtering method. The film forming temperature of the second insulation film 18 can be set at about 150° C. The film forming temperature of the second insulation film 18 is in a range of 140 to 160° C., for example. The thickness of the second insulation film 18 is 300 to 700 nm, for example. A material of the second insulation film 18 is not particularly limited as long as the material is an insulation film, and is, for example, an oxide film such as an SiO film.

Next, as is shown in FIG. 4, the first insulation film 17 and the second insulation film 18 on the contact layer 16 are removed, and the upper surface of the contact layer 16 is exposed. After that, the first electrode 19 and the second electrode 20 are formed, and the configuration of FIG. 1 is obtained. The point is the same as that in Embodiment 1. Specifically, the first electrode 19 is formed above the second upper cladding layer 15 so as to come in contact with the contact layer 16, and the second electrode 20 is formed on the back surface of the InP substrate 11 directly or via the electro-conductive layer.

In the semiconductor laser device manufacturing method according to Embodiment 2, the first insulation film 17 was formed by the ALD method, and the second insulation film 18 thicker than the first insulation film 17 was formed by the sputtering method. By adopting the ALD method, it becomes possible to form the first insulation film 17 which is excellent in coverage, is formed at low film forming temperature, and has a small stress. Furthermore, by adopting the sputtering method, it becomes possible to form the second insulation film 18 which has a small stress, at a low film forming temperature. Both of the first insulation film 17 and the second insulation film 18 in Embodiment 2 have lower stress than the film formed by the plasma CVD method, and accordingly, the stress and damage to the active layer 13 are reduced; and the reliability of the semiconductor laser device can be improved. In addition, the first insulation film 17 is thinned that is formed by the ALD method of which the film forming rate is small, and the second insulation film 18 that is formed by the sputtering method of which the film forming rate is large is made thicker than the first insulation film 17; and thereby the time period required for film formation can be shortened.

Embodiment 3

The semiconductor laser device manufacturing method according to Embodiment 3 is the same as that in Embodiment 1, in a point that the stacked structure having the mesa stripe structure is formed and the configuration of FIG. 2 is obtained. After the configuration of FIG. 2 has been formed, the first insulation film 17 is formed. The first insulation film is formed so as to have the same shape as the first insulation film 17 of FIG. 3, for example. A film forming method, a film forming temperature and a film thickness of the first insulation film 17 are the same as those of the first insulation film 17 in Embodiment 1, for example.

Figure 5:
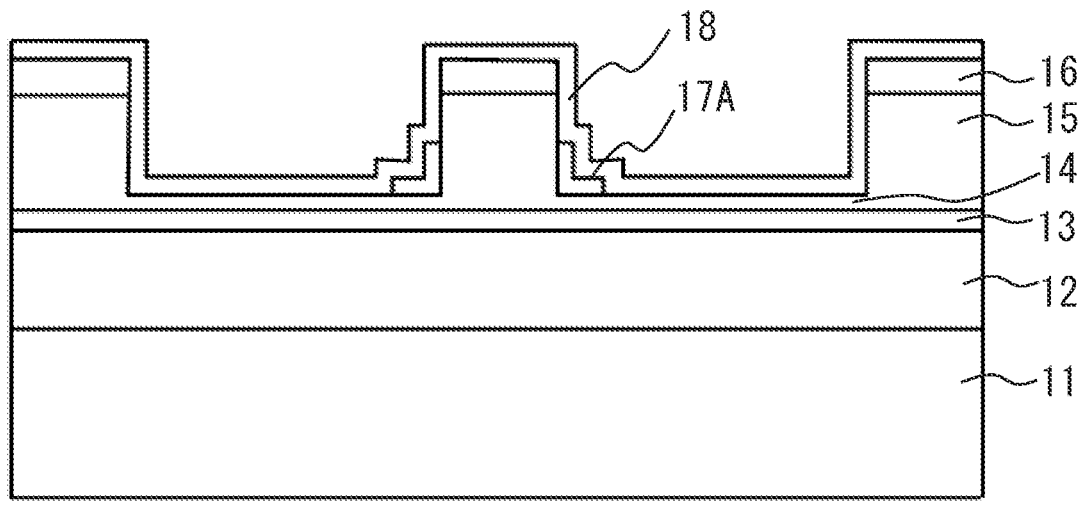
FIG. 5 is a cross-sectional view of a semiconductor laser device during manufacturing according to Embodiment 3.

After the first insulation film 17 has been formed, and before the second insulation film 18 is formed, a part of the first insulation film is etched so that the first insulation film 17 remains in a root portion of the mesa stripe structure. Specifically, a resist is formed on the first insulation film 17, and the first insulation film 17A is left only in the vicinity of the bottom of the mesa stripe structure, by photolithography and dry etching. In FIG. 5, the first insulation film 17A is shown which has remained at the root portion of the mesa stripe structure due to the etching. In the example of FIG. 5, the first insulation film 17A remains on a lower portion of a side face of the mesa stripe structure, and on the first upper cladding layer 14. The first insulation film 17A is formed in the root portion of the mesa stripe structure, while avoiding an upper portion of the side face of the mesa stripe structure, for example.

Thus, a part of the first insulation film 17 is removed by etching, and then the second insulation film 18 is formed. In FIG. 5, the second insulation film 18 is shown. The second insulation film 18 can be formed by the same film forming method and at the same film forming temperature so as to have the same film thickness, as those of the second insulation film 18 in Embodiment 1.

Figure 6:
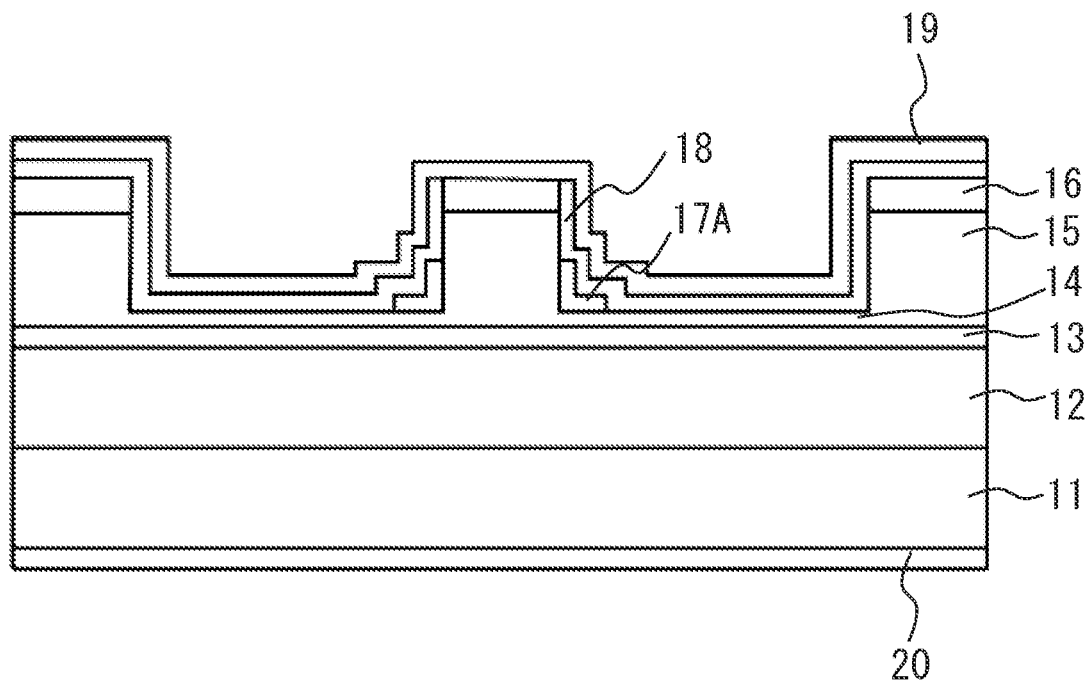
FIG. 6 is a cross-sectional view of a semiconductor laser device according to Embodiment 3.

Next, the second insulation film 18 on the upper surface of the mesa stripe structure is removed, and the contact layer 16 is exposed. Thereby, the second insulation film 18 covers the first insulation film 17 and the stacked structure, while exposing the upper portion of the second upper cladding layer 15. Next, a first electrode 19 which functions as a p-side electrode and has been electrically connected to the second upper cladding layer 15 is formed so as to come in contact with the contact layer 16. Next, the InP substrate 11 is thinned, the second electrode 20 is formed on the back-surface side of the InP substrate 11, and the semiconductor laser device shown in FIG. 6 is manufactured.

The first insulation film 17A is a sputtered film, and accordingly the coverage can become insufficient. In Embodiment 3, the first insulation film 17A is arranged only in the root portion of the mesa stripe structure. Accordingly, such a possibility is reduced that the electrode and the semiconductor layer come in contact with each other because of the first insulation film 17A having insufficient coverage, which can prevent the degradation of the characteristics. In addition, the second insulation film 18 is a film which is formed by the plasma CVD method at a high film forming temperature and has a large stress. Then, the second insulation film 18 was formed into, for example, 100 nm or thinner so as to be thinner than the first insulation film 17A, which thereby reduced the stress to be applied to the active layer 13. On the other hand, in order to secure a sufficient thickness of the entire insulation film, the first insulation film 17A which was a sputtered film having a low film forming temperature and a small stress was formed thicker than the second insulation film 18. The first insulation film 17A adopts the sputtered film, which can thereby reduce the damage to the active layer 13.

DESCRIPTION OF SYMBOLS

11 InP substrate, 12 lower cladding layer, 13 active layer, 14 first upper cladding layer, 15 second upper cladding layer, 16 contact layer, 17 first insulation film, 18 second insulation film, 19 first electrode, 20 second electrode

The invention claimed is:

1. A semiconductor laser device manufacturing method comprising:
    forming a stacked structure in which a lower cladding layer, an active layer and an upper cladding layer are stacked on an InP substrate in a shape having a mesa stripe structure;
    forming a first insulation film on a side face of the mesa stripe structure and lower portions on the left and right of the mesa stripe structure by a sputtering method, the lower portions are lower than the mesa stripe structure;
    forming a second insulation film thinner than the first insulation film, on the first insulation film by a plasma CVD method at a film forming temperature higher than that when the first insulation film has been formed; and
    forming a first electrode on a top surface of the mesa stripe structure, and forming a second electrode on a back surface of the InP substrate.

2. The semiconductor laser device manufacturing method according to claim 1, wherein a film forming temperature of the first insulation film is 140 to 160° C., and the film forming temperature of the second insulation film is 290 to 310° C.

3. The semiconductor laser device manufacturing method according to claim 2, wherein the first insulation film has a thickness of 300 to 700 nm, and the second insulation film has a thickness of 100 nm or smaller.

4. The semiconductor laser device manufacturing method according to claim 2, further comprising etching a part of the first insulation film to leave the first insulation film in a lower area of the side face of the mesa stripe structure and in the lower portions adjacent to a root portion of the mesa stripe structure, after the first insulation film has been formed and before the second insulation film is formed.

5. The semiconductor laser device manufacturing method according to claim 1, wherein the first insulation film has a thickness of 300 to 700 nm, and the second insulation film has a thickness of 100 nm or smaller.

6. The semiconductor laser device manufacturing method according to claim 5, further comprising etching a part of the first insulation film to leave the first insulation film in a lower area of the side face of the mesa stripe structure and in the lower portions adjacent to a root portion of the mesa stripe structure, after the first insulation film has been formed and before the second insulation film is formed.

7. The semiconductor laser device manufacturing method according to claim 1, further comprising etching a part of the first insulation film to leave the first insulation film in a lower area of the side face of the mesa stripe structure and in the lower portions adjacent to a root portion of the mesa stripe structure, after the first insulation film has been formed and before the second insulation film is formed.

8. A semiconductor laser device manufacturing method comprising:
    forming a mesa stripe structure by dry etching a stacked structure in which a lower cladding layer, an active layer and an upper cladding layer are stacked on an InP substrate, the surface of any layer of the stacked structure is exposed on the left and right of the mesa stripe structure;
    forming a first insulation film on a side face of the mesa stripe structure and lower portions on the left and right of the mesa stripe structure by an ALD method, the lower portions are lower than the mesa stripe structure;
    forming a second insulation film thicker than the first insulation film on the first insulation film by a sputtering method; and
    forming a first electrode on a top surface of the mesa stripe structure, and forming a second electrode on a back surface of the InP substrate.

9. The semiconductor laser device manufacturing method according to claim 8, wherein film forming temperatures of the first insulation film and the second insulation film are 140 to 160° C.

10. The semiconductor laser device manufacturing method according to claim 9, wherein the first insulation film has a thickness of 100 nm or smaller, and the second insulation film has a thickness of 300 to 700 nm.

11. The semiconductor laser device manufacturing method according to claim 8, wherein the first insulation film has a thickness of 100 nm or smaller, and the second insulation film has a thickness of 300 to 700 nm.

* * * * *